United States Patent
Gemello et al.

(10) Patent No.: US 9,627,532 B2
(45) Date of Patent: Apr. 18, 2017

(54) METHODS AND APPARATUS FOR TRAINING AN ARTIFICIAL NEURAL NETWORK FOR USE IN SPEECH RECOGNITION

(71) Applicant: Nuance Communications, Inc., Burlington, MA (US)

(72) Inventors: Roberto Gemello, Alpignano (IT); Franco Mana, Turin (IT); Dario Albesano, Venaria Reale (IT)

(73) Assignee: Nuance Communications, Inc., Burlington, MA (US)

( * ) Notice: Subject to any disclaimer, the term of this patent is extended or adjusted under 35 U.S.C. 154(b) by 360 days.

(21) Appl. No.: 14/308,054

(22) Filed: Jun. 18, 2014

(65) Prior Publication Data
US 2015/0371132 A1   Dec. 24, 2015

(51) Int. Cl.
| | |
|---|---|
| *G06E 1/00* | (2006.01) |
| *G06E 3/00* | (2006.01) |
| *G06F 15/18* | (2006.01) |
| *G06G 7/00* | (2006.01) |
| *H01L 29/78* | (2006.01) |

(Continued)

(52) U.S. Cl.
CPC ........... *H01L 29/7848* (2013.01); *G06N 3/04* (2013.01); *G10L 15/16* (2013.01); *H01L 27/1211* (2013.01); *H01L 29/0649* (2013.01); *H01L 29/0847* (2013.01); *H01L 29/1037* (2013.01); *H01L 29/161* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 4,975,961 A | * | 12/1990 | Sakoe | G06N 3/04 704/232 |
| 5,103,488 A | * | 4/1992 | Gemello | G06K 9/66 348/26 |

(Continued)

OTHER PUBLICATIONS

Computing with dynamic synapses: a case study of speech recognition Jim-Shih Liaw; T. W. Berger Neural Networks,1997., International Conference on Year: 1997, vol. 1 pp. 350-355 vol. 1, DOI: 10.1109/ICNN.1997.611692 IEEE Conference Publications.*

(Continued)

*Primary Examiner* — Michael B Holmes
(74) *Attorney, Agent, or Firm* — Wolfeld, Greenfield & Sacks, P.C.

(57) ABSTRACT

Methods and apparatus for training a multi-layer artificial neural network for use in speech recognition. The method comprises determining for a first speech pattern of the plurality of speech patterns, using a first processing pipeline, network activations for a plurality of nodes of the artificial neural network in response to providing the first speech pattern as input to the artificial neural network, determining based, at least in part, on the network activations and a selection criterion, whether the artificial neural network should be trained on the first speech pattern, and updating, using a second processing pipeline, network weights between nodes of the artificial neural network based, at least in part, on the network activations when it is determined that the artificial neural network should be trained on the first speech pattern.

21 Claims, 8 Drawing Sheets

(51) Int. Cl.
G06N 3/04 (2006.01)
G10L 15/16 (2006.01)
H01L 27/12 (2006.01)
H01L 29/06 (2006.01)
H01L 29/08 (2006.01)
H01L 29/10 (2006.01)
H01L 29/16 (2006.01)
H01L 29/161 (2006.01)
H01L 29/165 (2006.01)

(52) U.S. Cl.
CPC ........ *H01L 29/165* (2013.01); *H01L 29/1608* (2013.01); *H01L 29/785* (2013.01)

(56) References Cited

U.S. PATENT DOCUMENTS

| | | | | |
|---|---|---|---|---|
| 5,566,270 A * | 10/1996 | Albesano | ................ | G10L 15/16 704/232 |
| 5,742,739 A * | 4/1998 | Albesano | ................ | G06N 3/063 706/14 |
| 6,185,528 B1 * | 2/2001 | Fissore | ................... | G10L 15/26 704/232 |
| 7,376,558 B2 * | 5/2008 | Gemello | ............. | G10L 21/0208 704/226 |
| 7,769,580 B2 * | 8/2010 | Gemello | ................. | G10L 15/16 704/202 |
| 7,827,031 B2 * | 11/2010 | Albesano | ................ | G10L 15/16 700/48 |
| 8,103,606 B2 * | 1/2012 | Moussa | .................... | G06N 3/02 706/31 |
| 8,126,710 B2 * | 2/2012 | Gemello | ............... | G10L 15/065 704/202 |

OTHER PUBLICATIONS

Recurrent neural networks for speech modeling and speech recognition Tan Lee; P. C. Ching; L. W. Chan 1995 International Conference on Acoustics, Speech, and Signal Processing Year: 1995, vol. 5 pp. 3319-3322 vol. 5, DOI: 10.1109/ICASSP.1995. 479695 IEEE Conference Publications.*

Neural network lipreading system for improved speech recognition D. G. Stork; G. Wolff; E. Levine [Proceedings 1992] IJCNN International Joint Conference on Neural Networks Year: 1992, vol. 2 pp. 289-295 vol. 2, DOI: 10.1109/IJCNN.1992.226994 IEEE Conference Publications.*

Robust and fast Vowel Recognition Using Optimum-Path Forest João P. Papa; Aparecido N. Marana; André A. Spadotto; Rodrigo C. Guido; Alexandre X. Falcão 2010 IEEE International Conference on Acoustics, Speech and Signal Processing Year: 2010 pp. 2190-2193, DOI: 10.1109/ICASSP.2010.5495695 IEEE Conference Publications.*

Chen et al., Pipelined Back-Propagation for Context-Dependent Deep Neural Networks. Interspeech 2012. Portland, OR. 4 pages.

Dean et al., Large Scale Distributed Deep Networks. Advances in Neural Information Processing Systems. 2012:25.

Hoskins, Speeding up Artificial Neural Networks in the "Real" World. Proc Internat Joint Conference on Neural Networks. 1989:626. Abstract Only.

Petrowski et al., Performance Analysis of a Pipelined Backpropagation Parallel Algorithm. IEEE Trans Neural Networks. 1993;4(6):970-81.

Scanzio et al., Parallel Implementation of Artificial Neural Network Training for Speech Recognition. Pattern Recognition Letters. 2010;31:1302-09.

Seide et al., Conversational Speech Transcription Using Context-Dependent Deep Neural Networks. Proc Interspeech Florence. Aug. 28-31, 2011:437-440.

Zickenheiner et al., Pipelining and Parallel Training of Neural Networks on Distributed-Memory Multiprocessors. Proceeding of Neural Networks. IEEE World Congress on Computational Intelligence.1994:2052-57.

* cited by examiner

METHODS AND APPARATUS FOR TRAINING AN ARTIFICIAL NEURAL NETWORK FOR USE IN SPEECH RECOGNITION

BACKGROUND

Speech recognition systems convert input audio including speech to recognized text. During recognition, acoustic waveforms are typically divided into a sequence of discrete time vectors (e.g., 10 ms segments) called "frames," and one or more of the frames are converted into sub-word (e.g., phoneme or syllable) representations using various approaches. In a first approach, input audio is compared to a set of templates and the sub-word representation for the template in the set that most closely matches the input audio is selected as the sub-word representation for that input. In a second approach, statistical modeling is used to convert input audio to a sub-word representation (e.g., to perform acoustic-phonetic conversion). When statistical modeling is used, acoustic waveforms are processed to determine feature vectors for one or more of the frames of the input audio, and statistical models are used to assign a particular sub-word representation to each frame based on its feature vector.

Hidden Markov Models (HMMs) are statistical models that are often used in speech recognition to characterize the spectral properties of a sequence of acoustic patterns. For example, acoustic features of each frame of input audio may be modeled by one or more states of an HMM to classify the set of features into phonetic-based categories. Gaussian Mixture Models (GMMs) are often used within each state of an HMM to model the probability density of the acoustic patterns associated to that state. Artificial neural networks (ANNs) may alternatively be used for acoustic modeling in a speech recognition system. Such ANNs may be trained to estimate the posterior probability of each state of an HMM given an acoustic pattern. Some statistical-based speech recognition systems favor the use of ANNs over GMMs due to better accuracy in recognition results and faster computation times of the posterior probabilities of the HMM states.

SUMMARY

Some embodiments are directed to a method of training a multi-layer artificial neural network for use in speech recognition, wherein each of the layers in the artificial neural network includes a plurality of nodes, each of the plurality of nodes in a layer being connected to a plurality of nodes in one or more adjacent layers of the artificial neural network, wherein the connections between nodes in the artificial neural network are associated with network weights. The method comprises providing a plurality of speech patterns as input to the artificial neural network, determining for a first speech pattern of the plurality of speech patterns, using a first processing pipeline, network activations for the plurality of nodes of the artificial neural network in response to providing the first speech pattern as input to the artificial neural network, determining based, at least in part, on the network activations and a selection criterion, whether the artificial neural network should be trained on the first speech pattern, and updating, using a second processing pipeline, the network weights based, at least in part, on the network activations when it is determined that the artificial neural network should be trained on the first speech pattern.

Other embodiments are directed to an apparatus configured to train a multi-layer artificial neural network for use in speech recognition, wherein each of the layers in the artificial neural network includes a plurality of nodes, each of the plurality of nodes in a layer being connected to a plurality of nodes in one or more adjacent layers of the artificial neural network, wherein the connections between nodes in the artificial neural network are associated with network weights. The apparatus comprises at least one processor programmed to implement a first processing pipeline and a second processing pipeline for training the artificial neural network based, at least in part, on a plurality of speech patterns provided to the artificial neural network as input, wherein the first processing pipeline is configured to determine for a first speech pattern of the plurality of speech patterns, network activations for the plurality of nodes of the artificial neural network in response to providing the first speech pattern as input to the artificial neural network, wherein the at least one processor is further programmed to determine based, at least in part, on the network activations and a selection criterion, whether the artificial neural network should be trained on the first speech pattern, and wherein the second processing pipeline is configured to update the network weights based, at least in part, on the network activations when it is determined that the artificial neural network should be trained on the first speech pattern.

Other embodiments are directed to a non-transitory computer readable medium encoded with a plurality of instructions that, when executed by at least one computer processor, perform a method of training a multi-layer artificial neural network for use in speech recognition, wherein each of the layers in the artificial neural network includes a plurality of nodes, each of the plurality of nodes in a layer being connected to a plurality of nodes in one or more adjacent layers of the artificial neural network, wherein the connections between nodes in the artificial neural network are associated with network weights. The method comprises providing a plurality of speech patterns as input to the artificial neural network, determining for a first speech pattern of the plurality of speech patterns, using a first processing pipeline, network activations for the plurality of nodes of the artificial neural network in response to providing the first speech pattern as input to the artificial neural network, determining based, at least in part, on the network activations and a selection criterion, whether the artificial neural network should be trained on the first speech pattern, and updating, using a second processing pipeline, the network weights for the plurality of nodes of the artificial neural network based, at least in part, on the network activations when it is determined that the artificial neural network should be trained on the first speech pattern.

It should be appreciated that all combinations of the foregoing concepts and additional concepts discussed in greater detail below (provided that such concepts are not mutually inconsistent) are contemplated as being part of the inventive subject matter disclosed herein.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

As discussed above, artificial neural networks (ANNs) used for speech recognition are sometimes favored over GMM approaches due to the reduction in search time required to compute the posterior probabilities of the HMM states and the increased accuracy in modeling. However, ANNs typically require a substantial amount of training on example speech patterns, which takes a significant amount of time. For example, training an ANN using a single processor typically takes one to two weeks. Some embodiments of the invention are directed to methods and apparatus for increasing the speed of training an ANN for use in speech recognition.

An ANN commonly used for speech recognition is the feed-forward multi-layer perceptron (MLP), which includes a plurality of layers of nodes forming a directed graph. The most basic MLP includes an input layer and an output layer. MLPs with three or more layers are also commonly referred to as deep neural networks (DNNs) and include one or more "hidden" layers arranged between the input and output layers. Each layer in the MLP includes a plurality of processing elements called nodes, which are connected to other nodes in adjacent layers of the network. The connections between nodes are associated with weights that define the strength of association between the nodes. Each node is associated with a non-linear activation function, which defines the output of the node given one or more inputs. Typical activation functions used for input and hidden layers in an ANN are sigmoid functions, whereas a softmax function is often used for the output layer.

One technique for training an ANN is the supervised learning technique called backpropagation. This technique relies on iterative gradient descent optimizations to minimize the network errors in the ANN by adjusting the connection weights between the nodes. Network errors are a measure of difference between actual outputs of the ANN and an expected output given a particular input, and may be determined using known techniques.

Figure 1:
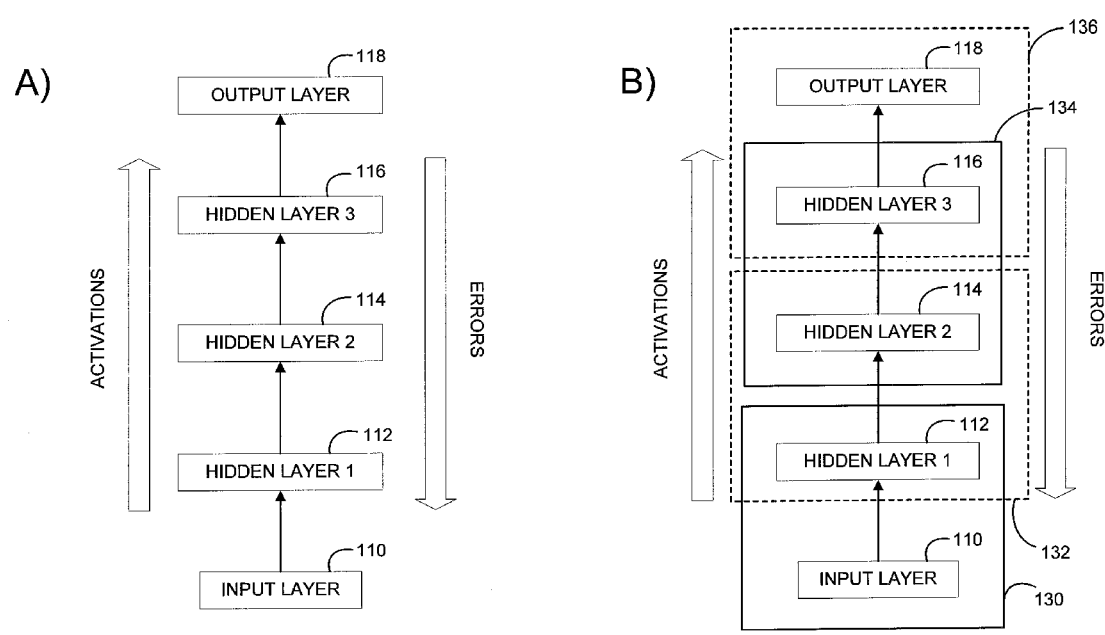
FIG. 1A is a schematic of a process for training a multi-layer artificial neural network using a single processor.
FIG. 1B is a schematic of a pipelined process for training a multi-layer artificial neural network using multiple processors.
Figure 2:
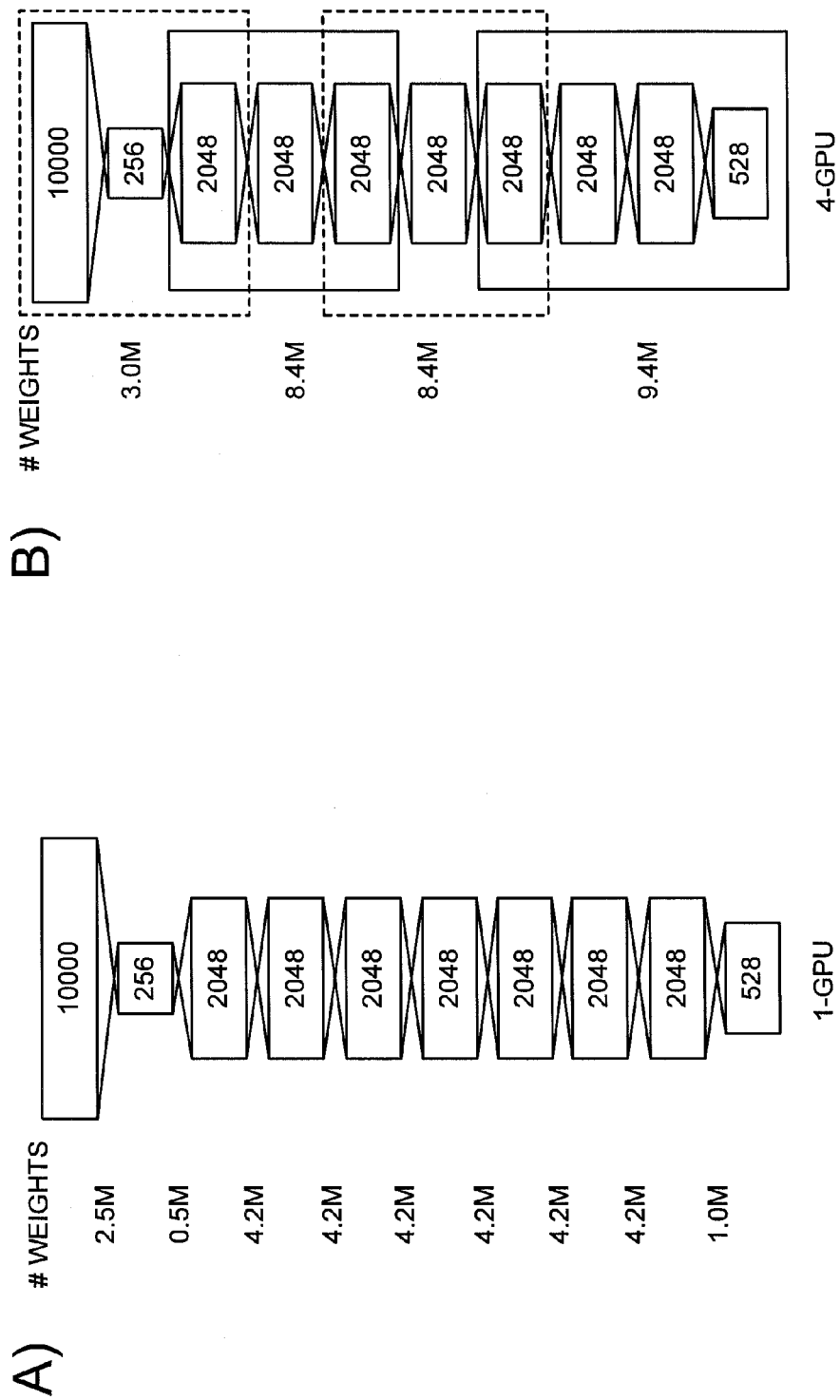
FIG. 2A is a schematic of network weights calculated between layers of a multi-layer artificial neural network using a single processor.
FIG. 2B is a schematic of network weights calculated between layers of a multi-layer artificial neural network using multiple processors.

FIG. 1A shows a schematic of an illustrative ANN that includes five layers—an input layer 110, an output layer 118, and three hidden layers 112, 114, and 116 arranged between the input and output layers. Each of the layers may include any suitable number of nodes. For example, input layer 110 may include 465 nodes, hidden layers 112, 114, and 116 may each include 2048 nodes, and output layer 118 may include 10000 nodes. The number of network weights to be determined for each training iteration is the product of the number of nodes in adjacent layers, as shown in FIGS. 2A and 2B. FIG. 1A is shown as having three hidden layers. However, it should be appreciated that any suitable number of hidden layers (including a single hidden layer) may alternatively be used. The multi-layer structure of an ANN facilitates parallel processing using multiple simultaneously active processors, as discussed in more detail below.

Training an ANN is an iterative process that includes processing steps for determining node activations in the feed-forward direction (i.e., from input layer 110 to output layer 118) and propagation of network errors in the backward direction (i.e., from output layer 118 to input layer 110). When used for speech recognition, the inputs to the input layer 110 are a plurality of audio frames (e.g., 10 ms in length) comprising speech. In some embodiments, rather than processing individual frames, multiple frames (e.g., 9-15 frames) are processed together as an input block, and data for multiple time-sequential blocks may be stored in a data structure (e.g., a matrix) to be processed as input, as discussed in further detail below.

In a typical ANN training algorithm, the feed-forward computations determine, for each layer, the output network activations of the corresponding nodes given a layer input vector $X_i = (x_1, x_2, \ldots, x_n)_t$ as $$net_i = b_i + \sum_{j=1}^{n} w_{ij} \cdot x_j; \; out_i = f(net_i),$$

where n is the number of nodes of the current layer, and $f(net_i)$ is the sigmoid function $$f_{sigmoid}(net_i) = \frac{1}{1 + \exp(-net_i)}$$

for all hidden layers of the ANN, and the softmax function $$f_{softmax}(net_i) = \frac{\exp(net_i)}{\sum_{j=1}^{n} \exp(net_j)}$$

for the output layer 118. After the forward stage, the outputs for nodes in each layer in the ANN are used to determine network errors, which are then updated in a backpropagation stage during which the errors are propagated from the output layer to the underlying hidden layers in the ANN. An illustrative error function used to determine the error for probabilities is the cross-entropy error:

$$E_i = -t_i \cdot \ln(out_i) - (1-t_i) \cdot \ln(1-out_i).$$

Backpropagation of this error to update the network weights $w_{ij}$ may proceed as follows:

1. Compute the derivative of the error with respect to the input for every node i:

$$\delta_i^{(layer)} = \frac{\partial E_i}{\partial net_i^{(layer)}} = \frac{\partial E_i}{\partial out_i^{(layer)}} \cdot \frac{\partial out_i^{(layer)}}{\partial net_i^{(layer)}};$$

if layer is the output layer with cross-entropy function and softmax activation function:

$$\delta_i^{(layer)} = \left[\frac{(1-t_i)}{(1-out_i)} - \frac{t_i}{out_i}\right] \cdot [out_i^{(layer)} \cdot (1-out_i^{(layer)})],$$

where the term in the first parenthesis is the derivative of the cross-entropy error function, and the term in the second parenthesis is the derivative of the softmax activation function.

if layer is a hidden layer with sigmoid activation function:

$$\delta_i^{(layer)} = \left(\sum_{k=1}^{m} \delta_k^{(layer+1)} \cdot w_{ki}\right) \cdot [out_i^{(layer)} \cdot (1-out_i^{(layer)})],$$

where the term in the second parenthesis is the derivative of the sigmoid activation function.

2. Compute the variation of the weights:

$$\Delta w_{ij}^{(layer)} = -\eta \cdot \delta_i^{(layer)} \cdot out_j^{(layer-1)} + \beta \cdot \Delta w_{ij}^{(layer)}$$

3. Update the weights:

$$w_{ij} = w_{ij} + \Delta w_{ij}.$$

Further details of some existing techniques for training an ANN using backpropagation are found in Scanzio et al., *Pattern Recognition Letters* 31 (2010) 1302-1309, which is incorporated by reference herein.

Some conventional techniques for speeding the training of ANNs include using multiple processors (e.g., central processing units (CPUs), graphics processing units (GPUs)) to parallelize the computations. FIGS. 1A and 2A illustrate ANN processing architectures where a single processor is used to perform all of the calculations. As shown in FIGS. 1B and 2B, at least some of the calculations may be parallelized by dividing the ANN into multiple processing units (e.g., including one or more layers of the ANN), each of which can be assigned to a different processor for performing calculations in parallel. For example, FIG. 1B illustrates a technique called pipelined backpropagation, which is an approximation of the standard backpropagation technique that operates by distributing the computations for the layers of the ANN across multiple processors (e.g. GPUs) to form a pipeline.

The processing in the architecture of FIG. 1B is pipelined in that the data output from one GPU flows to the next GPU, as in an assembly line. At least one layer is shared between multiple GPUs acting both as the output layer for a lower order layer and as an input layer for a higher order layer. As shown, data flows from GPU 130 to GPU 132 to GPU 134, to GPU 136 in the feed-forward direction, and from GPU 136 to GPU 134 to GPU 132 to GPU 130 in the backpropagation direction. All GPUs are configured to work simultaneously on the data they have. In the simplest case, the number of layers (hidden and output) equals the number of GPUs, and each GPU is assigned to process calculations for a single layer. If the number of layers in the ANN exceeds the number of GPUs, multiple layers may be grouped on a GPU, as shown in FIG. 2B, discussed in further detail below.

Each input pattern travels twice per GPU—once in the feed-forward direction and once for backpropagation. Because the data needed for an update of the network errors arrives at a delay due to the pipeline roundtrip, updates to the network weights in the ANN use delayed data, and the deeper the network (i.e., due to more layers), the longer the delay. As the activation computations in the feed-forward direction and the error computations in the backpropagation are out of sync, queues of activations from the feed-forward direction should be kept to compute the weight variations with the corresponding activations and errors, compensating the delay introduced by the pipelined error backpropagation. However, some approximations are introduced as the weights used in forward and backward propagation are out of sync due to the delayed network weight updates introduced by the pipeline.

FIGS. 2A and 2B schematically show processing architectures for training an illustrative ANN having eight hidden layers and an output layer using one or more processors. The output layer includes a number of nodes corresponding to the number of states of an HMM, as discussed above. FIG. 2A shows an ANN architecture where a single GPU is used to determine the activations, errors, and updated weights for the ANN by sequentially performing calculations in the layers of the ANN. FIG. 2B shows an architecture where the layers of the ANN are split into four blocks, each of which can be processed by different GPUs in parallel, as discussed above in connection with FIG. 1B. By splitting the ANN into multiple processing blocks, the dimensionality of the neural network can be reduced to processing within each of the blocks to enable faster training of the ANN compared to the single GPU implementation shown in FIG. 2A.

The training of an ANN can also be accelerated by retraining the ANN only on patterns that have not been already sufficiently learned by the ANN. Whether an input pattern has been sufficiently learned by the ANN may be determined in any suitable way. For example, an error measure for the input pattern may be compared to a threshold value, and when it is determined that the error measure is less than the threshold value, the ANN may not need to be retrained on that pattern. By skipping patterns on which the ANN does not need to be retrained, the entire training process may be accelerated. An example of this type of selection technique is the focused-attention backpropagation (FABP) learning strategy. Using FABP, backpropagation is performed only for patterns having a Mean Square Error (MSE) greater than a given threshold.

The inventors have recognized and appreciated that existing techniques for training ANNs can be improved, such that the training time for the ANN can be reduced dramatically. For example, the pipelined backpropagation (PBP) and focused attention backpropagation (FABP) techniques described above, although both useful in speeding training of an ANN are generally incompatible because the pipelined approach requires that the feed-forward and back-propagated processing be synchronous, whereas FABP is, by definition, asynchronous since data corresponding to patterns that have already been learned by the ANN are skipped in the backpropagation stage.

Some embodiments of the invention are directed to improved techniques for accelerating training of an ANN used for speech recognition by combining aspects of a PBP technique with a FABP technique to achieve training speed improvements that are not possible using either of these techniques in isolation. Use of novel data processing architectures for harmonizing the two techniques which, as discussed above, are in principle incompatible, are described in more detail below.

Figure 3:
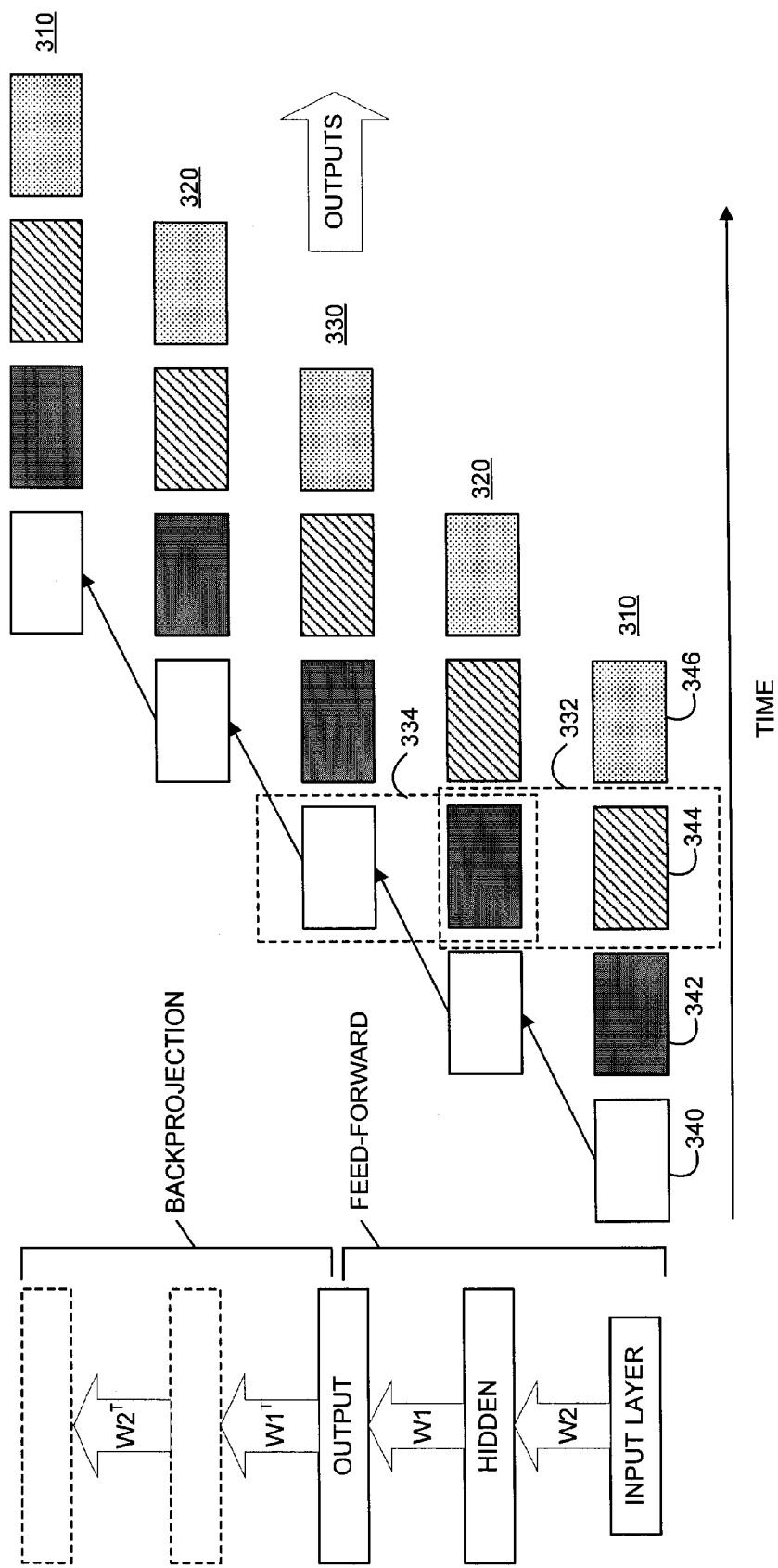
FIG. 3 is a schematic of a pipelined process for training a multi-layer artificial neural network using feed-forward and backpropagation stages.

FIG. 3 schematically illustrates a multi-processor pipeline architecture for training an ANN. In this architecture, both the feed-forward and backpropagation computations involved in the training process realize a pipeline, where each processing node (e.g., GPU) operates in parallel to perform the calculations needed to train the ANN by updating the network weights. As shown, the entire pipeline of the ANN is unrolled such that one entire iteration is shown in a linear fashion. The illustrated ANN is a three layer network that includes an input layer 310, a hidden layer 320, and an output layer 330. The layers below the output layer 330 represent the use of the pipeline in the feed-forward direction to determine the network activations and the errors for nodes in the network in response to input patterns. The layers above the output layer 330 represent use of the pipeline during backpropagation of the errors through the hidden layer 320 and the input layer 310 to update the network weights during training of the ANN.

The computations in the illustrated ANN may proceed in parallel using two processors (e.g., two GPUs). A first processor 332 computes activations based on input patterns in input block 344 and weights W2 for the connections between the nodes of the input layer 310 and the nodes of the hidden layer 320. A second processor 334 computes activations for the nodes in hidden layer 320 based on the output of layer 310 and weights W1 for the connections between the nodes of the hidden layer 320 and the nodes of the output layer 330. As discussed in further detail below, during backpropagation, processor 334 may also update the weights ($W1^T$) between the nodes in layers 330 and 320, and processor 332 may update the weights ($W2^T$) between the nodes in layers 320 and 310.

As shown, the pipeline processes multiple input blocks of data at each layer. As discussed above, when training an ANN for use in speech recognition, each of the input data blocks may correspond to a time-sequence window of a plurality of speech input frames (e.g., 9-15 frames of input speech), and each of the frames may correspond to an acoustic pattern that is learned by the ANN. In the example of FIG. 3, four different input blocks (i.e., input blocks 340, 342, 344, and 346), each of which includes different data, are processed by each layer. It should be appreciated, however, that any suitable number of input blocks may alternatively be used, and embodiments of the invention are not limited in this respect. In some embodiments, the input data may be arranged in an input matrix or any other suitable data structure for processing by the processors of the pipelined architecture.

The inventors have recognized and appreciated that using a single pipeline for both feed-forward and backpropagation calculations results in delays if the amount of data processed in the backpropagation direction is less than the amount of data processed in the feed-forward direction. For example, although all input patterns may be processed in the feed-forward direction to determine the network activations for those patterns, less than all of the input patterns may be used for backpropagation to update the network weights. Techniques such as FABP select only patterns that have not been sufficiently learned by the ANN, resulting in less data being processed in the backpropagation direction than in the feed-forward direction. Some embodiments of the invention address this discrepancy between the feed-forward and backpropagated directions by employing multiple processing pipelines during training of an ANN. For example, a first processing pipeline may be used for feed-forward activation calculations and a second processing pipeline may be used for backpropagation calculations to update the network weights.

Figure 4:
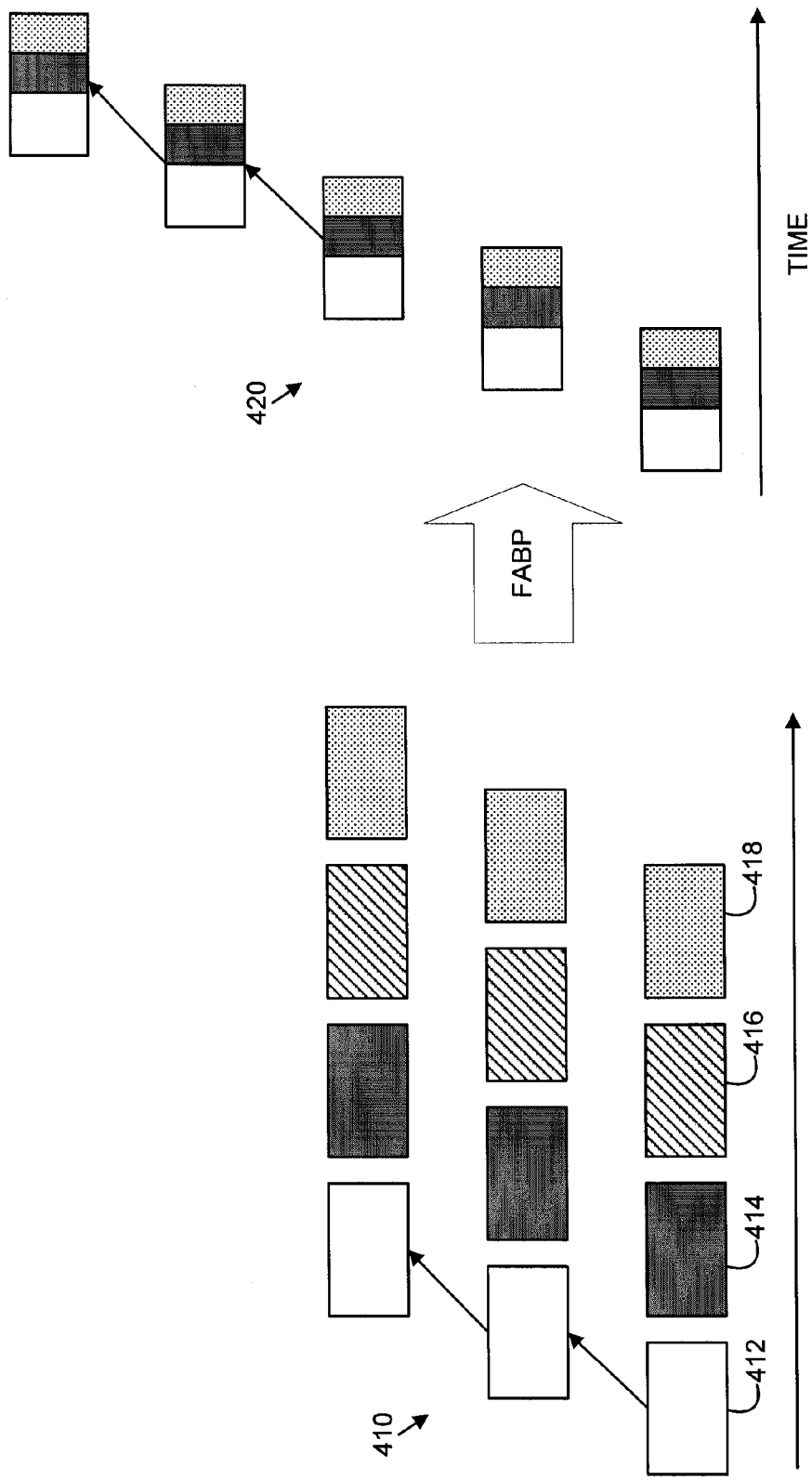
FIG. 4 is a schematic of a pipelined process for training a multi-layer artificial neural network using multiple processing pipelines in accordance with some embodiments of the invention.

FIG. 4 shows a schematic of a multi-pipeline architecture that may be used for training an ANN in accordance with some embodiments of the invention. A first pipeline 410 performs feed-forward calculations and stores the activations for input patterns for each layer in the ANN. The network activations for the nodes in a layer of the ANN may be determined using any suitable techniques including, but not limited to, the techniques discussed above. As shown, four input blocks (i.e., input blocks 412, 414, 416, and 418) are processed by each layer, though it should be appreciated that any suitable number of input blocks may be processed. Based on one or more selection criteria, such as an FABP criterion, all or a portion of the activations determined for nodes at each layer are copied from the first pipeline 410 to a second pipeline 420 for updating the network weights during backpropagation processing. In some iterations, none of the activations may be copied to the second pipeline 420. For example, if all of the input patterns satisfy the criterion (e.g., have errors that are less than a threshold value), then the ANN is not trained on those patterns and the activations for the patterns are merely discarded, and an iteration with new training data is initiated.

In some embodiments, actual copying of the activations from the first pipeline 410 to the second pipeline 420 is not required, as the second pipeline may alternatively include one or more pointers to the selected activations of the first pipeline 420 without the need to make a copy of the relevant data. Techniques for using pointers to reference data in a data structure without the need to copy the data to a new data structure are not described in detail herein, as such techniques are well understood by those of skill in the art.

As shown in FIG. 4, based on a FABP selection criterion, only a portion of the data processed in feed-forward pipeline 410 is copied to and processed by pipeline 420. For example, in the illustrated iteration, the activations determined by the feed-forward processing in pipeline 410 were subjected to the FABP selection criterion and it was determined that some acoustic patterns in each of input blocks 412, 414, and 418 should be copied to pipeline 420 for further processing. By contrast, all of the patterns in input block 416 were determined to be sufficiently learned by the ANN, and thus were not copied to pipeline 420. After the activations corresponding to the input patterns to be retrained have been selected and copied to pipeline 420, backpropagation of the errors corresponding to the selected patterns proceeds to update the network errors for the selected patterns.

Figure 5:
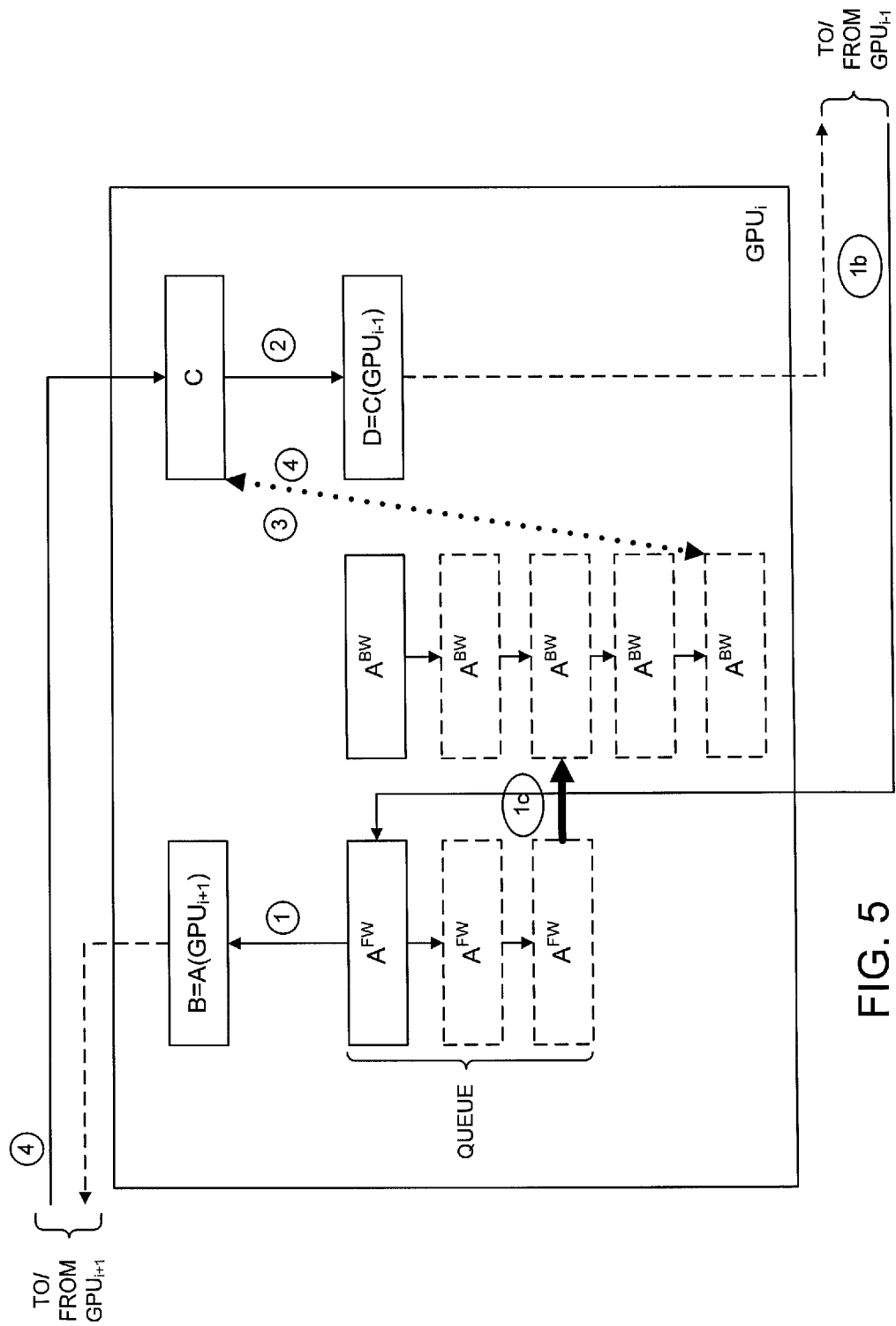
FIG. 5 is a schematic of illustrative processing steps within a layer of a multi-layer artificial neural network in accordance with some embodiments of the invention.

FIG. 5 shows a schematic architecture and processing steps for a GPU assigned to perform calculations for an inner block of layers (i.e., a processing block that does not include the input or output layer) of an ANN, in accordance with some embodiments of the invention. In the upper portion of FIG. 5 the connections to a higher-order $GPU_{i+1}$ are shown. Corresponding connections to a lower-order $GPU_{i-1}$ are also shown in the lower portion of FIG. 5. The solid arrows into $GPU_i$ represent data received by $GPU_i$ to perform calculations, and the dashed arrows out of $GPU_i$ represent data that is output to adjacent GPUs.

As shown, boxes labeled $A^{FW}$, $A^{BW}$, B, C and D represent data structures that store data used by $GPU_i$. Data structures labeled $A^{FW}$ represent a queue used by the GPU to store its inputs coming from $GPU_{i-1}$ for the forward pipeline. As discussed above, due to the delay introduced by the pipeline, the inputs $A^{FW}$ may be queued in order to have them ready and synchronized when the corresponding error becomes available on the backpropagation pipeline. The length of the queue may depend on the amount of delay required by the forward processing stage. A second forward/backward pipeline is used to realize the error backpropagation when the FABP technique is used, as discussed above. The data structures $A^{BW}$ represent the forward portion of the second pipeline. The forward portion of the second pipeline is filled by copying data from the first pipeline, as discussed with reference to FIG. 4. In this way, the second pipeline is filled only with the input data selected by the selection criteria (e.g., the FABP selection criterion). The length of the queues for the first pipeline and for the second pipeline may be different since the length of the first pipeline queue is dictated by the forward processing delay only, whereas the length of the second pipeline queue is dictated by delays introduced in both forward and backward processing.

Data structure B contains the output of the forward stage. For example, data structure B may include a vector of activations corresponding to the nodes of $GPU_j$. This output is provided as input to $GPU_{i+1}$, which itself includes data structures $A^{FW}$ that receives and stores the activations as input.

Data structure C is used to store error data received from $GPU_{i+1}$. This error data is back-propagated through the network weights of the block for generating the $GPU_i$ error data. Data in data structures $A^{BW}$ and C are used together to update the network weights for the connections between the nodes of the layers of the ANN processing block assigned to $GPU_j$, as discussed above.

Figure 6:
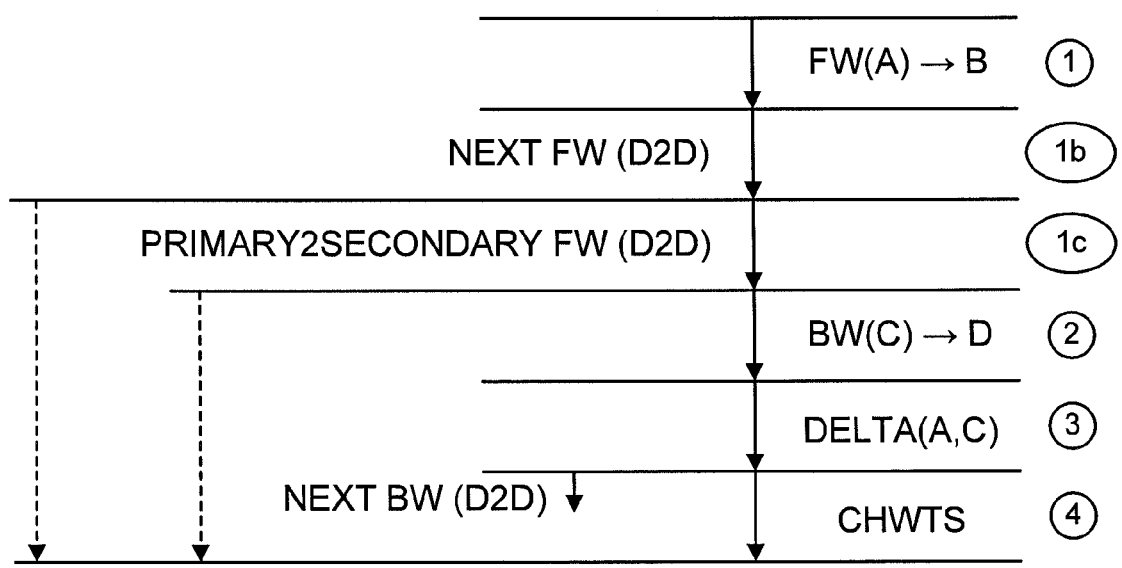
FIG. 6 is a flowchart of the processing steps illustrated in the schematic of FIG. 5.

FIG. 6 illustrates a timeline for performing processing steps using the processing architecture shown in FIG. 5. In step 1, the activations for each of the nodes in one or more layers processed by $GPU_i$ are calculated based on data in data structures $A^{FW}$, and the outputs are stored in data structure B. In a multi-GPU architecture, these calculations can proceed in parallel operating on different data. After all of the GPUs have concluded step 1, a peer-to-peer memory copy from one GPU to another GPU is executed to provide the outputs of step 1 as inputs to its neighbor GPU (Next FW) in step 1b. At this point, the computations on $GPU_i$ may be halted (left dashed arrow) if it is determined by the FABP logic that there are no input patterns for training. Otherwise, if it is determined that there is at least one input pattern for training, in step 1c, the input pattern(s) accepted by the selection criterion are copied from the first pipeline $A^{FW}$ to the second pipeline $A^{BW}$.

If the data structure $A^{BW}$ is full, the processing operations continue with a session of backpropagation. Otherwise, the processing is halted (right dashed arrow) until the data structure $A^{BW}$ can be filled with data from the next iteration (i.e., no backpropagation is performed for the current iteration). If the data structure $A^{BW}$ is full, the processing proceeds to step 2 where errors backpropagation is performed according to:

$$Error_j = o_j * (1 - o_j) * \sum_q (w_{qj} * Error_q),$$

where $o_j$ is the output of node j determined from the data copied to data structure $A^{BW}$, $w_{qj}$ indicates each weight connecting node j to all neurons of the upper layer, i.e., the nodes that receive its output, and $Error_q$ indicates the error computed on the upper layer neurons. This is the error to be passed to $GPU_{i-1}$ and it is stored in data structure D. Before sending the GPU neighbor the errors computed in step 2, the delta error may be computed in accordance with $\Delta_{ij}(t)=dE/dw_{ij}=\eta*Error_i*o_j+\beta*\Delta(t-1)$, as discussed below. In step 3, the retro-propagated error from the backward chain C is propagated back through the subnet till C and then the delta error is computed using the time-aligned data structures $A^{BW}$ and C and the formula above. In step 4, the concurrency of the pipelines may be leveraged to acquire a new block of error data from the backward chain (Next BW) and the network weights may be updated (CHWTS) as follows: $W_{ij}(t)=W_{ij}(t-1)+\Delta_{ij}(t)$.

In some embodiments, use of a selection criterion such as the FABP criterion, speeds up training of an ANN due to selectively retraining the network during the backpropagation stage only on input patterns the network has not sufficiently learned, and by skipping training on patterns for which the network has been sufficiently trained. As discussed above in connection with FIG. 4, some embodiments include a first processing pipeline configured to perform feed-forward calculations and a second processing pipeline configured to perform backpropagation calculations on input patterns selected based on the FABP selection criterion.

As illustrated in FIG. 4, the second processing pipeline may be configured to process only a particular number of input patterns as determined by the size of one or more input processing buffer of the second processing pipeline. Input patterns selected by the FABP criterion, but that do not fit in the processing buffer of the second processing pipeline because it is full, are referred to herein as residual patterns.

In some conventional applications of FABP, after a backward stage has been performed and the network weights have been updated, residual patterns are submitted again in the next feed-forward iteration, introducing memory and computation overhead. The inventors have recognized and appreciated that this re-submission of patterns (referred to as "re-run" herein) is incompatible with the pipelined backpropagation techniques described herein. Accordingly, in some embodiments, "re-run" using the residual patterns is not performed and these patterns are directly used in the next backpropagation iteration. This introduces an approximation, as the activation and errors of the residual patterns have been obtained with weights that are not up to date. However, this approximation does not prevent the training to converge and further speeds training, avoiding the computational overhead associated with "re-running."

Figure 7:
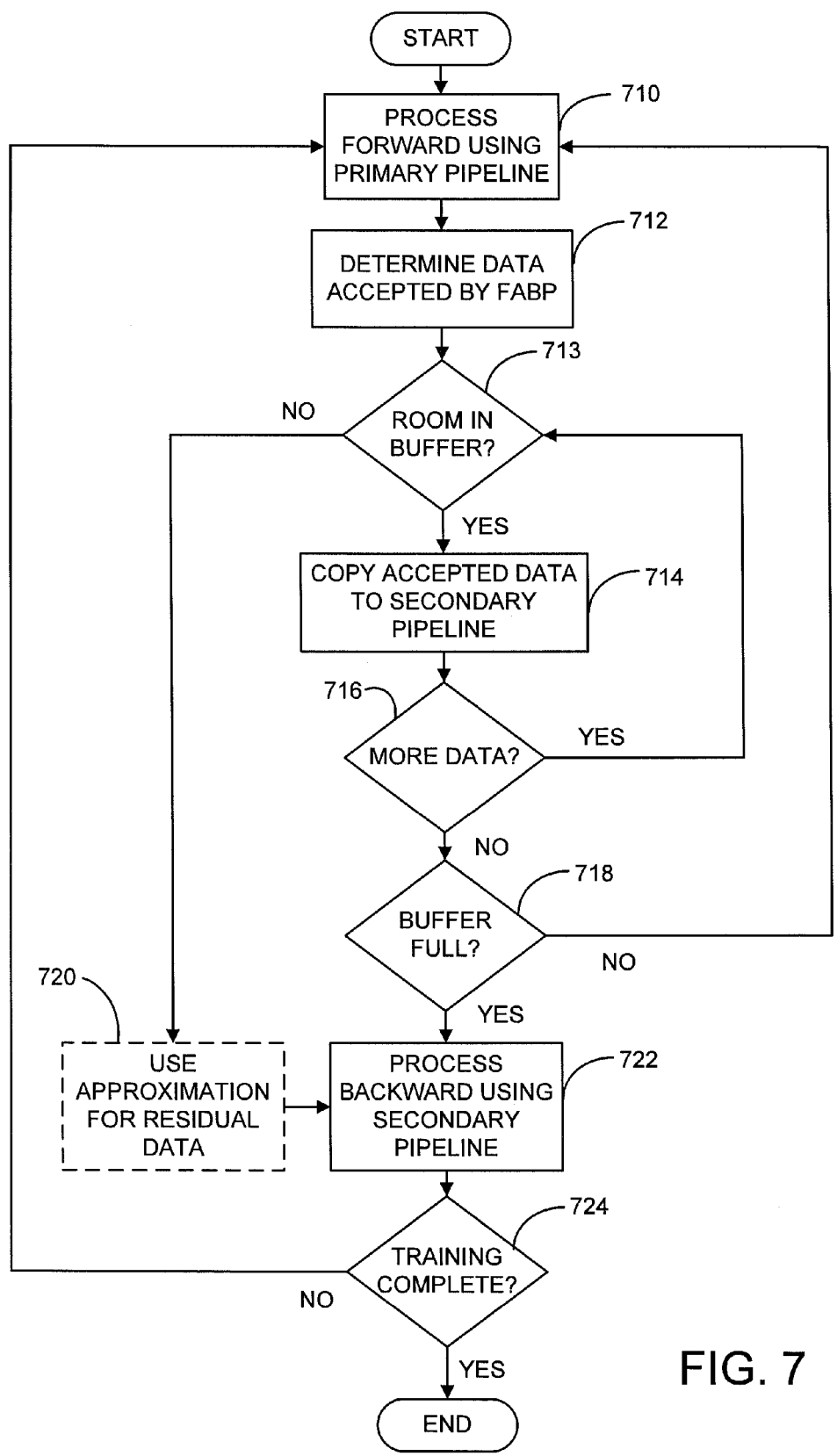
FIG. 7 is a flowchart of a process for training a multi-layer artificial neural network in accordance with some embodiments of the invention.

FIG. 7 shows an illustrative process for training an ANN in accordance with some embodiments of the invention. In act 710, a first processing pipeline receives a plurality of input patterns (e.g., input windows of speech) and the input patterns are processed to determine network activations in the feed-forward direction. The process then proceeds to act 712, where a selection criterion such as FABP is used to analyze errors associated with the determined network activations for the input patterns to assess which input patterns have not been sufficiently learned by the network.

The process then proceeds to act 713, where it is determined whether there is additional room in the processing buffer of the second processing pipeline for at least one input pattern accepted by the selection criterion. If it is determined that there is additional room in the processing buffer (i.e., the processing buffer is not full), the process proceeds to act 714 where network activations corresponding to the at least one input pattern selected by the selection criterion are copied to the processing buffer of the second processing pipeline. As discussed above, in some embodiments, actual copying of the network activations from one or more data structures of the first processing pipeline to one or more data structures of the second processing pipeline is not required, as the second processing pipeline may alternatively include data structures with pointers to locations in memory where the selected network activations reside, or some other suitable programming technique may be used to identify the location of the network activations without requiring actual copying from data structures in the first pipeline to data structures in the second pipeline. It should be appreciated that the second processing pipeline may include multiple processing buffers as shown, for example, in FIG. 4, where each layer of the ANN is associated with a separate processing buffer. Accordingly, copying network activations from one or more data structures of the first processing pipeline to one or more data structures of the second processing pipeline may comprise copying the network activations to the corresponding processing buffer in the second processing pipeline. For example, network activations for a first hidden layer may be copied to a processing buffer associated with a first hidden layer of the second processing pipeline, network activations for a second hidden layer may be copied to a processing buffer associated with the second hidden layer of the second processing pipeline, and so on.

After copying (or linking using a pointer or other programming technique) data from the first processing pipeline to the second processing pipeline, the process proceeds to act 716, where it is determined whether there are additional input patterns that have been selected based on the selection criterion to be copied to the second processing pipeline. If it is determined that there are additional data to be copied, the process returns to act 713, where it is determined whether there is enough space remaining in the input processing buffer(s) of the second processing pipeline to accommodate the additional data.

If it is determined in act 713 that there is not sufficient room in the input processing buffer(s) of the second processing pipeline, the input patterns having network activation data that will not fit in the processing buffers are considered to be associated with residual patterns. The process then proceeds to act 720, where an approximation is used for the residual patterns that are not processed during the current backpropagation iteration. A suitable approximation for dealing with the residual patterns is discussed above.

If it is determined in act 716 that there is no more data to copy from the first processing pipeline to the second processing pipeline, the process proceeds to act 718, where it is determined whether the processing buffer(s) of the second processing pipeline are full. If it is determined that the processing buffer(s) are not full, the process returns to act 710, where a next iteration of the feed-forward calculations are performed using the first processing pipeline. If it is determined that the processing buffer(s) of the second processing pipeline are full, the process proceeds to act 722, where the second processing pipeline is used to update the network weights by backpropagating the errors, as discussed above.

After updating the network errors, the process proceeds to act 724, where it is determined whether training of the ANN is complete. Any suitable criterion or criteria may be used to determine when training of the ANN is complete, and embodiments of the invention are not limited in this respect. If it is determined that additional training of the ANN is required, the process returns to act 710, where a next iteration of the feed-forward calculations using the updated weights is performed. In some embodiments, each iteration of the feed-forward calculations is performed for all input patterns in the training set, whereas only a subset of the input patterns are used during backpropagation to update the network errors. As the network is trained, fewer and fewer input patterns may be trained using backpropagation as the network learns more input patterns. When it is determined in act 724 that the ANN has been sufficiently trained, the process ends.

Experimental Results

The above-described techniques for speeding the training of an artificial neural network for use in speech recognition were tested through experimentation for validation. A first experiment involved mono- and multi-GPU training of an ANN with seven layers of 2000 units, low rank decompositions of the last layer to 256 units, and 3258 output units on an American English mail-to-text training set.

Multi-GPU training performed in accordance with some embodiments of the invention employed pipelined parallelization on multiple GPUs inside the same server. An aim of this experiment was to verify convergence of the network, evaluate the speedup and also evaluate word error recognition (WER) results using the trained model. The architecture of the ANN was 429-7x2000-256-3258, where the 256 units linear layer before the output was the low-rank decomposition.

Input data for this experiment was a proprietary American English mail-to-text training set (346.2 hours after silence trimming).

The training setups were:
Mono-GPU setup: FABP on, bunch=256, batch=128, GPU=1×K10
Multi-GPU setup:
  1. FABP on, bunchsize=128 or 256, batchsize=128, GPU=2×K10
  2. FABP on, bunchsize=128 or 256, batchsize=128, GPU=4×K10
  3. FABP on, bunchsize=128 or 256, batchsize=128, GPU=2×K20

Bunchsize was defined as the mini-batch (number of input blocks) used in the forward computation, and batchsize was defined as the mini-batch (number of input patterns) used in error backpropagation. If FABP is active (meaning that the FABP selection criterion is used), bunchsize can be greater than batchsize as FABP discards some input patterns associated with errors lower than a threshold. In such cases, computing a larger mini-batch in the feed-forward direction may be used in view of discarding some of the input patterns with FABP.

Results of this experiment are reported in the Table 1. Table 1 reports the number and kind of GPUs, the bunch and batch sizes, the splitting of ANN layers on the pipeline stages (Pipeline balance), the final mean square error of the training (MSE), the elapsed time, the speedup vs. the Mono-GPU case (run on a K10 GPU), the WER computed on an American English mail-to-text test set, and the Frame Error Rate (FER) computed on a subset of training set.

Regarding pipeline balance, 0,4:4,9 means that 2 GPUs were used, and that ANN layers from 0 to 4 were allocated on the first GPU, while layers 4 to 9 were allocated on the second GPU; layer 4 is the output of the first pipeline stage and the input of the second pipeline stage. FER was computed as the average on the FER of the single output classes (macro-average FER) after prior division of ANN outputs. FER was computed on the first 1000 files of the training set.

TABLE 1

Experimental results of parallel Multi-GPU training vs. Mono-GPU training

| #GPU/ GPU type | bunch/ batch | Pipeline balance | Final MSE | Elapsed time | Speedup vs. Mono-GPU (K10) | WER | FER (macro avg) |
|---|---|---|---|---|---|---|---|
| Mono | 256/128 | — | 0.617 | 76 h 54 m | — | 22.48 | 0.584 |
| 2/k10 | 128/128 | 0, 4:4, 9 | 0.622 | 38 h 36 m | 2.0x | 22.57 | 0.595 |
| 2/k10 | 256/128 | 0, 4:4, 9 | 0.625 | 37 h 09 m | 2.1x | 22.57 | 0.599 |
| 4/k10 | 128/128 | 0, 2:2, 4:4, 6:6, 9 | 0.627 | 22 h 48 m | 3.4x | 22.81 | 0.601 |
| 4/k10 | 256/128 | 0, 2:2, 4:4, 6:6, 9 | 0.631 | 20 h 49 m | 3.7x | 23.06 | 0.609 |
| 2/k20 | 128/128 | 0, 4:4, 9 | 0.623 | 28 h 03 m | 2.7x | 22.72 | 0.596 |
| 2/k20 | 256/128 | 0, 4:4, 9 | 0.625 | 25 h 17 m | 3.0x | 22.53 | 0.599 |

Some embodiments are configured to perform multi-lingual training of an ANN. In such a case, training of different languages can share the same model, with the exception of the last layer that is specific to each language. In this kind of training the Multi-GPU approach still works, although the training speed gains are less than for the mono-lingual training due to the fact that at the end of each pattern the pipeline must be completely emptied to allow the switch of different networks for each language. In a second experiment, the training speed-up achieved during multi-lingual training was evaluated. The results of this experiment are shown in Table 2.

TABLE 2

Speed-up comparison between Mono-lingual and Multi-lingual training

| # GPU/GPU type | Speed-up (Mono-lingual) | Speed-up (Multi-lingual) |
|---|---|---|
| Mono | — | — |
| 2/k10 | 2.0x | 1.8x |
| 4/k10 | 3.4x | 2.5x |

As shown in Table 2, when two GPUs are used, the speed-up is 1.8x compared to 2.0x for the mono-lingual case. When four GPUs are used, the speed-up is 2.5x compared to 3.4x for the mono-lingual case.

Speed-up was quantified using a measure of how much the multi-GPU algorithm was faster than the corresponding mono-GPU algorithm, and was defined by the formula:

$$S_p = \frac{T_1}{T_p},$$

where p is the number of GPUs, $T_1$ is the execution time of the mono-GPU algorithm, and $T_p$ is the execution time of the multi-GPU algorithm with p GPUs. Linear speedup or ideal speedup is obtained when $S_p = p$. When running an algorithm with linear speedup, doubling the number of processors doubles the speed. A speedup of more than p using p processors is called super linear speedup.

The results obtained for the experiments are the following, for the three cases:

Mono-GPU (K10) vs. 2 GPU (K10): A direct speedup comparison between the mono-GPU technique and the multi-GPU technique can be done in this case, as K10 processors were used in both cases. In this case the speedup obtained with 2 GPU was 2.0x. Increasing the bunchsize to 256 resulted in a speedup increase to 2.1x. The speedup is high (linear or super linear) also because the multi-GPU code introduced some approximations (not present in the mono-GPU algorithm, discussed in further detail below) that additionally improve performance.

Mono-GPU (K10) vs 4 GPU (K10): A direct speedup comparison between the mono-GPU technique and the multi-GPU technique was done in the 4 GPU case, as K10 processors were used in both cases. In this case the speedup obtained with 4 GPU was 3.4x (with bunch=batch=128) and 3.7x if the bunchsize was increased to 256. The GPU load was measured as 56% 84% 84% 85% for the 4 GPUs.

Mono-GPU (K10) vs. 2 GPU (K20): In this case a direct speedup comparison between the mono-GPU technique and the multi-GPU technique cannot be done, as K10 processors were used for the mono-GPU case and K20 processors were used for 2 GPU case. Nevertheless, in this case the speedup obtained with 2 GPU was 2.7x with bunch=128, and 3.0x with bunch=256. The GPU load was measured as 79% 94% for the 2 GPUs.

The results of the above-described experiment show that the performances of Multi-GPU training are very similar to those of Mono-GPU training. There was, on average, a small decrease in performance in the order of −0.7% WER for 2 GPUs and −1.4% WER for 4 GPUs. These decreases in performance are likely due to the math approximations introduced by the pipeline delays. No clear decrease in performance was introduced when a larger bunch size of 256 was used.

The trained ANNs were tested using the FER (Frame Error Rate) accuracy measure on a subset of the training set. FER was defined as 1—FACC (Frame Accuracy). The FACC measure was computed as follows: for each acoustic class the frames labeled as pertaining to the class were tested by running the ANN, and if the correct class was the winner the frames were counted as "true positive" (TP) cases while if another class was the winner the frames were computed as "false negative" (FN) cases. FACC was then computed as FACC=TP/(TP+FN). The FACC measure is also often referred to as "class Recall," which refers to the percentage of samples of the class that are correctly assigned to the class.

When FACC is determined after averaging on the frames it is referred to as a Micro Average, whereas if a first average on the frames inside each class is performed followed by an average of the classes, it is referred to as the Macro Average FACC. Micro Average is affected by the class prior probability (class cardinality) while Macro Average is not, and considers each class equal, in spite of its cardinality.

FACC (and FER) can be computed on all acoustic units including a silence unit, or excluding a silence unit, and with or without division of the ANN outputs by prior probabilities of the classes. Table 1 above reports the Macro Average after prior division, including also silence units, computed on a subset of 1000 files of the training set. Prior division was used as it is less affected by class cardinality. FER is a good predictor of the WER. Thus, FER was used as a preliminary evaluation of ANN accuracy.

As discussed above, multi-GPU pipelined ANN training techniques in accordance with some embodiments of the invention may introduce approximations into the calculations that are not present when using a mono-GPU technique. Two of these approximations are a delayed weight update and the elimination of FABP re-runs, as discussed briefly above, and discussed in more detail below.

Pipelined parallelization using multiple processors in accordance with some embodiments of the invention introduces a delay in the update of weights during the training. The weights are updated at different times in the different stages of the pipeline. This results in a math approximation due to the fact that the same pattern (e.g., input frame) uses slightly different weights during the feed-forward computation and the error backpropagation, whereas in the sequential (one processor) training the weights in both directions are the same.

As discussed above, when FABP is used as a selection criterion for determining which patterns to copy from the first processing pipeline to the second processing pipeline, patterns that, after forward computation, have an error lower than a threshold are discarded (e.g., their network activations are not copied to the second processing pipeline). Thus, more than one forward iteration may be needed to fill the processing buffer(s) of the second processing pipeline for a backpropagation iteration. When the processing buffer(s) are filled, backpropagation is performed, thereby producing a change in the weights. However, patterns that have already computed the forward propagation but have not been consumed by backpropagation, as they exceeded the backpropagation processing buffer size would ordinarily be re-computed in the forward direction with the updated weights (referred to as "re-run"). When pipelined parallelization is used, re-run introduces complexity in the pipelined algorithm. To avoid this complexity, some embodiments avoid re-run and thereby introduce a second math approximation. The approximation becomes greater if the bunch size (forward mini-batch) increases. Because re-run is not performed, this approximation also improves training speedup.

A third experiment was run to test the multi-GPU training using a different training set. In this experiment, multi-GPU training (with 4 K10 GPUs) of the ANN (7 layers of 2048 units, low rank decompositions of the last layer to 256 and 10000 outputs) was trained using a large Voice Search training set (3000 hours). An aim of this experiment was to verify convergence and evaluate training speed-up compared to a previous training with a mono-GPU training using a K20 processor. The architecture of the ANN low-rank 256 linear network for this experiment was: 528-7*2048-256-10000. The training set used for this experiment was a Voice Search 3000H training set (2280.3 hours after silence trimming)

The training setups were:

Mono-GPU setup: FABP=1 bunch=256 batch=128, GPU=1×K20

Multi-GPU setup: FABP=1 bunch=128 batch=128, GPU=4×K10

Results of this experiment are shown in Table 3.

TABLE 3

Experimental results

| # GPU/ GPU type | Pipeline balance | Final MSE | Elapsed time | Speedup vs. Mono-GPU (K10) | FER (macro avg) |
|---|---|---|---|---|---|
| Mono/K20 | — | 0.594 | 14 d 4 h 23 m | — | 0.615 |
| Mono/K10 | — | 0.597 | 16 d 20 h 39 m | — | 0.617 |
| 2/K20 | 0, 4:4, 9 | 0.600 | 6 d 2 h 53 m | 2.3× | 0.622 |
| 4/K10 | 0, 3:3, 5:5, 7:7, 9 | 0.601 | 4 d 11 h 59 m | 3.7× | 0.624 |

The convergence during training for all cases was good with only a small difference in the final error, due to the approximation introduced by the delayed weight updates in the pipelined parallelization of the multi-GPU implementations.

The results obtained for the experiments are the following, for the two cases:

Mono-GPU (K20) vs 2 GPU (K20): In the 2 GPU case using K20 GPUs, a direct speed-up comparison between the mono-GPU technique and the multi-GPU technique can be done with the "mono K20" case. In this case the speed-up obtained with 2 GPU is 2.3×. The speed-up is greater than the number of GPUs (i.e., greater than 2) because the multi-GPU implementation introduces some approximations not present in the mono-GPU technique, as described above.

Mono-GPU (K10) vs 4 GPU (K10): In the 4 GPU case using K10 GPUs, a direct speed-up comparison between the mono-GPU technique and the multi-GPU technique can be done with the "mono K10" case. A comparison of the final speed-up results in a 3.8× speed-up. From a practical point of view, training a target ANN with 7 layers of 2048 units, low rank decompositions of the last layer to 256 and 10000 outputs, with a 3000H training set, can be accomplished in 4.5 days with four K10 GPUs or in 6 days with two K20 GPUs, while training on a single GPU required nearly 17 days on a K10 GPU and 14 days on a K20 GPU.

In the third experiment, the trained ANN was tested using the FER (Frame Error Rate) accuracy measure on a subset of the training set. The Macro Average after prior division, including also silence was computed on a subset of 122 hours of the training set. Prior division was used as it is less affected by class cardinality. The results showed that the 2-GPU and 4-GPU cases had a slightly better FER than the mono-GPU case.

Figure 8:
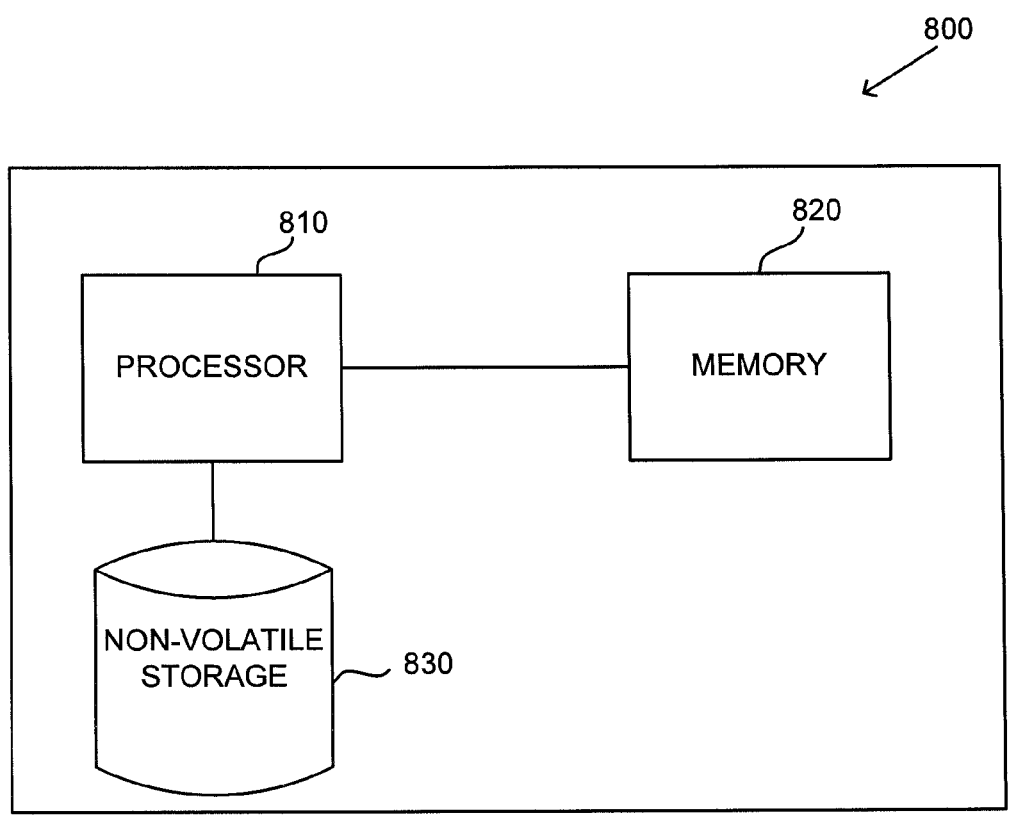
FIG. 8 is an exemplary computer system that may be used to implement some embodiments of the invention.

An illustrative implementation of a computer system 800 that may be used in connection with any of the embodiments of the invention described herein is shown in FIG. 8. The computer system 800 may include one or more processors 810 and one or more computer-readable non-transitory storage media (e.g., memory 820 and one or more non-volatile storage media 830). The processor 810 may control writing data to and reading data from the memory 820 and the non-volatile storage device 830 in any suitable manner, as the aspects of the present invention described herein are not limited in this respect. To perform any of the functionality described herein, the processor 810 may execute one or more instructions stored in one or more computer-readable storage media (e.g., the memory 820), which may serve as non-transitory computer-readable storage media storing instructions for execution by the processor 810.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

In this respect, it should be appreciated that one implementation of the embodiments of the present invention comprises at least one non-transitory computer-readable storage medium (e.g., a computer memory, a USB drive, a flash memory, a compact disk, a tape, etc.) encoded with a computer program (i.e., a plurality of instructions), which, when executed on a processor, performs the above-discussed functions of the embodiments of the present invention. The computer-readable storage medium can be transportable such that the program stored thereon can be loaded onto any computer resource to implement the aspects of the present invention discussed herein. In addition, it should be appreciated that the reference to a computer program which, when executed, performs the above-discussed functions, is not limited to an application program running on a host computer. Rather, the term computer program is used herein in a generic sense to reference any type of computer code (e.g., software or microcode) that can be employed to program a processor to implement the above-discussed aspects of the present invention.

Various aspects of the present invention may be used alone, in combination, or in a variety of arrangements not specifically discussed in the embodiments described in the foregoing and are therefore not limited in their application to the details and arrangement of components set forth in the foregoing description or illustrated in the drawings. For example, aspects described in one embodiment may be combined in any manner with aspects described in other embodiments.

Also, embodiments of the invention may be implemented as one or more methods, of which an example has been provided. The acts performed as part of the method(s) may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed. Such terms are used merely as labels to distinguish one claim element having a certain name from another element having a same name (but for use of the ordinal term).

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. An apparatus configured to train a multi-layer artificial neural network for use in speech recognition, wherein each of the layers in the artificial neural network includes a plurality of nodes, each of the plurality of nodes in a layer being connected to a plurality of nodes in one or more adjacent layers of the artificial neural network, wherein the connections between nodes in the artificial neural network are associated with network weights, the apparatus comprising:

at least one processor programmed to implement a first processing pipeline and a second processing pipeline for training the artificial neural network based, at least in part, on a plurality of speech patterns provided as input to the artificial neural network;

wherein the first processing pipeline is configured to determine for a first speech pattern of the plurality of speech patterns provided as input to the artificial neural network, network activations for the plurality of nodes of the artificial neural network;

wherein the at least one processor is further programmed to determine based, at least in part, on the network activations and a selection criterion, whether the artificial neural network should be trained on the first speech pattern, wherein determining whether the artificial neural network should be trained on the first speech pattern comprises:

determining an output error for the first speech pattern based, at least in part, on the network activations; and determining that the artificial neural network should be trained on the first speech pattern when the output error is greater than a threshold value; and wherein the second processing pipeline is configured to update the network weights based, at least in part, on the network activations when it is determined that the artificial neural network should be trained on the first speech pattern.

2. The apparatus of claim 1, wherein the selection criterion comprises a focused attention backpropagation criterion, and wherein determining whether the artificial neural network should be trained on the first speech pattern comprises applying the focused attention back propagation criterion to the network activations.

3. The apparatus of claim 1, wherein the at least one processor is further programmed to:

determine based, at least in part, on the selection criterion, whether the first speech pattern has already been learned by the artificial neural network; and copy data corresponding to the first speech pattern from the first processing pipeline to the second processing pipeline when it is determined that the first speech pattern has not already been learned by the artificial neural network.

4. The apparatus of claim 1, wherein determining the output error comprises determining a mean squared error based, at least in part, on the network activations.

5. The apparatus of claim 3, wherein copying data corresponding to the first speech pattern comprises determining whether a processing buffer of the second processing pipeline is full and copying the data when it is determined that the processing buffer is not full.

6. The apparatus of claim 5, wherein the at least one processor is further programmed to update the network weights in response to determining that the processing buffer is full.

7. The apparatus of claim 3, wherein copying the data comprises creating a pointer in a data structure of the second processing pipeline that references a location of the data in a data structure of the first processing pipeline.

8. The apparatus of claim 1, wherein updating the network weights comprises backpropagating errors through multiple layers of the multi-layer artificial neural network.

9. The apparatus of claim 1, wherein the at least one processor is programmed to process data in the first processing pipeline using multiple processors and process data in the second processing pipeline using the multiple processors.

10. The apparatus of claim 9, wherein processing data using multiple processors comprises assigning to each of the multiple processors, at least two layers of the multi-layer artificial neural network, wherein the multiple processors are arranged to pass data from one processor to another processor to enable pipelined parallel processing of data in the first processing pipeline and the second processing pipeline.

11. The apparatus of claim 9, wherein at least two of the multiple processors are graphics processing units (GPUs).

12. The apparatus of claim 1, wherein the at least one processor is further programmed to:
determine whether the artificial neural network has been sufficiently trained; and
iteratively calculate the network activations using the first processing pipeline and updating the network weights using the second processing pipeline until it is determined that the artificial neural network has been sufficiently trained.

13. An apparatus configured to train a multi-layer artificial neural network for use in speech recognition, wherein each of the layers in the artificial neural network includes a plurality of nodes, each of the plurality of nodes in a layer being connected to a plurality of nodes in one or more adjacent layers of the artificial neural network, wherein the connections between nodes in the artificial neural network are associated with network weights, the apparatus comprising:
at least one processor programmed to implement a first processing pipeline and a second processing pipeline for training the artificial neural network based, at least in part, on a plurality of speech patterns provided to the artificial neural network as input;
wherein the first processing pipeline is configured to determine for a first speech pattern of the plurality of speech patterns, network activations for the plurality of nodes of the artificial neural network in response to providing the first speech pattern as input to the artificial neural network;
wherein the at least one processor is further programmed to determine based, at least in part, on the network activations and a selection criterion, whether the artificial neural network should be trained on the first speech pattern, wherein the selection criterion comprises a focused attention backpropagation criterion, and wherein determining whether the artificial neural network should be trained on the first speech pattern comprises applying the focused attention back propagation criterion to the network activations; and
wherein the second processing pipeline is configured to update the network weights based, at least in part, on the network activations when it is determined that the artificial neural network should be trained on the first speech pattern.

14. The apparatus of claim 13, wherein the at least one processor is further programmed to:
determine based, at least in part, on the selection criterion, whether the first speech pattern has already been learned by the artificial neural network; and
copy data corresponding to the first speech pattern from the first processing pipeline to the second processing pipeline when it is determined that the first speech pattern has not already been learned by the artificial neural network.

15. The apparatus of claim 13, wherein the at least one processor comprises at least two graphics processing units (GPUs), wherein each of the at least two GPUs is assigned to perform calculations for at least two layers of the multi-layer artificial neural network, and wherein the at least two GPUs are arranged to pass data between each other to enable pipelined parallel processing of data in the first processing pipeline and the second processing pipeline.

16. An apparatus configured to train a multi-layer artificial neural network for use in speech recognition, wherein each of the layers in the artificial neural network includes a plurality of nodes, each of the plurality of nodes in a layer being connected to a plurality of nodes in one or more adjacent layers of the artificial neural network, wherein the connections between nodes in the artificial neural network are associated with network weights, the apparatus comprising:
at least one processor programmed to implement a first processing pipeline and a second processing pipeline for training the artificial neural network based, at least in part, on a plurality of speech patterns provided as input to the artificial neural network;
wherein the first processing pipeline is configured to determine for a first speech pattern of the plurality of speech patterns provided as input to the artificial neural network, network activations for the plurality of nodes of the artificial neural network;
wherein the at least one processor is further programmed to determine based, at least in part, on the network activations and a selection criterion, whether the artificial neural network should be trained on the first speech pattern; and
wherein the second processing pipeline is configured to update the network weights based, at least in part, on the network activations when it is determined that the artificial neural network should be trained on the first speech pattern, wherein updating the network weights comprises backpropagating errors through multiple layers of the multi-layer artificial neural network.

17. The apparatus of claim 16, wherein the selection criterion comprises a focused attention backpropagation criterion, and wherein determining whether the artificial neural network should be trained on the first speech pattern comprises applying the focused attention back propagation criterion to the network activations.

18. The apparatus of claim 16, wherein the at least one processor is further programmed to:
determine based, at least in part, on the selection criterion, whether the first speech pattern has already been learned by the artificial neural network; and
copy data corresponding to the first speech pattern from the first processing pipeline to the second processing pipeline when it is determined that the first speech pattern has not already been learned by the artificial neural network.

19. An apparatus configured to train a multi-layer artificial neural network for use in speech recognition, wherein each of the layers in the artificial neural network includes a plurality of nodes, each of the plurality of nodes in a layer being connected to a plurality of nodes in one or more adjacent layers of the artificial neural network, wherein the connections between nodes in the artificial neural network are associated with network weights, the apparatus comprising:

at least one processor programmed to implement a first processing pipeline and a second processing pipeline for training the artificial neural network based, at least in part, on a plurality of speech patterns provided as input to the artificial neural network;

wherein the first processing pipeline is configured to determine for a first speech pattern of the plurality of speech patterns provided as input to the artificial neural network, network activations for the plurality of nodes of the artificial neural network;

wherein the at least one processor is further programmed to determine based, at least in part, on the network activations and a selection criterion, whether the artificial neural network should be trained on the first speech pattern;

wherein the second processing pipeline is configured to update the network weights based, at least in part, on the network activations when it is determined that the artificial neural network should be trained on the first speech pattern; and wherein the at least one processor is further programmed to determine based, at least in part, on the selection criterion, whether the first speech pattern has already been learned by the artificial neural network and copy data corresponding to the first speech pattern from the first processing pipeline to the second processing pipeline when it is determined that the first speech pattern has not already been learned by the artificial neural network.

20. An apparatus configured to train a multi-layer artificial neural network for use in speech recognition, wherein each of the layers in the artificial neural network includes a plurality of nodes, each of the plurality of nodes in a layer being connected to a plurality of nodes in one or more adjacent layers of the artificial neural network, wherein the connections between nodes in the artificial neural network are associated with network weights, the apparatus comprising:

at least one processor programmed to implement a first processing pipeline and a second processing pipeline for training the artificial neural network based, at least in part, on a plurality of speech patterns provided as input to the artificial neural network;

wherein the first processing pipeline is configured to determine for a first speech pattern of the plurality of speech patterns provided as input to the artificial neural network, network activations for the plurality of nodes of the artificial neural network;

wherein the at least one processor is further programmed to determine based, at least in part, on the network activations and a selection criterion, whether the artificial neural network should be trained on the first speech pattern;

wherein the second processing pipeline is configured to update the network weights based, at least in part, on the network activations when it is determined that the artificial neural network should be trained on the first speech pattern; and wherein the at least one processor is programmed to process data in the first processing pipeline using multiple processors and process data in the second processing pipeline using the multiple processors.

21. An apparatus configured to train a multi-layer artificial neural network for use in speech recognition, wherein each of the layers in the artificial neural network includes a plurality of nodes, each of the plurality of nodes in a layer being connected to a plurality of nodes in one or more adjacent layers of the artificial neural network, wherein the connections between nodes in the artificial neural network are associated with network weights, the apparatus comprising:

at least one processor programmed to implement a first processing pipeline and a second processing pipeline for training the artificial neural network based, at least in part, on a plurality of speech patterns provided as input to the artificial neural network;

wherein the first processing pipeline is configured to determine for a first speech pattern of the plurality of speech patterns provided as input to the artificial neural network, network activations for the plurality of nodes of the artificial neural network;

wherein the at least one processor is further programmed to determine based, at least in part, on the network activations and a selection criterion, whether the artificial neural network should be trained on the first speech pattern;

wherein the second processing pipeline is configured to update the network weights based, at least in part, on the network activations when it is determined that the artificial neural network should be trained on the first speech pattern; and wherein the at least one processor is further programmed to determine whether the artificial neural network has been sufficiently trained and iteratively calculate the network activations using the first processing pipeline and updating the network weights using the second processing pipeline until it is determined that the artificial neural network has been sufficiently trained.

* * * * *